United States Patent
Horita et al.

(10) Patent No.: US 10,714,336 B2
(45) Date of Patent: Jul. 14, 2020

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Hideki Horita, Toyama (JP); Masato Terasaki, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 0 days.

(21) Appl. No.: 16/358,369

(22) Filed: Mar. 19, 2019

(65) Prior Publication Data

US 2019/0214250 A1    Jul. 11, 2019

Related U.S. Application Data

(63) Continuation of application No. PCT/JP2016/077698, filed on Sep. 20, 2016.

(51) Int. Cl.
*H01L 21/02* (2006.01)
*C23C 16/40* (2006.01)
*C23C 16/455* (2006.01)

(52) U.S. Cl.
CPC ...... *H01L 21/02304* (2013.01); *C23C 16/401* (2013.01); *C23C 16/455* (2013.01); *C23C 16/45553* (2013.01); *H01L 21/0228* (2013.01); *H01L 21/02164* (2013.01); *H01L 21/02211* (2013.01); *H01L 21/02592* (2013.01); *H01L 21/02667* (2013.01)

(58) Field of Classification Search
CPC ......... H01L 21/02304; H01L 21/02164; H01L 21/02211; H01L 21/0228; H01L 21/02592; H01L 21/02667; C23C 16/401; C23C 16/455; C23C 16/45553
See application file for complete search history.

(56) References Cited

U.S. PATENT DOCUMENTS

2014/0220788 A1    8/2014  Sano et al.
2017/0345645 A1*  11/2017  Harada ............ H01L 21/02255

FOREIGN PATENT DOCUMENTS

JP      04-357838 A      12/1992
JP      2014154652 A     8/2014

OTHER PUBLICATIONS

Search Report in corresponding International Patent Application No. PCT/JP2016/077698, dated Dec. 20, 2016.

* cited by examiner

*Primary Examiner* — Seahvosh Nikmanesh
(74) *Attorney, Agent, or Firm* — Edell, Shapiro & Finnan, LLC

(57) ABSTRACT

According to one of the embodiments of the present disclosure, there is provided a technique that includes: (a) forming a seed layer in an amorphous state on a substrate by supplying a source gas to the substrate; (b) polycrystallizing the seed layer by processing the seed layer by heat; and (c) performing a cycle a predetermined number of times to form an oxide film on a polycrystallized seed layer and to oxidize the polycrystallized seed layer, the cycle including: (c-1) supplying the source gas to the substrate; and (c-2) supplying an oxygen-containing gas and a hydrogen-containing gas to the substrate, wherein (c-1) and (c-2) are non-simultaneously performed.

12 Claims, 12 Drawing Sheets

| SAMPLE | 1 | 2 | 3 | 4 |
|---|---|---|---|---|
| FURNACE TEMPERATURE | 450°C | 500°C | 550°C | 600°C |
| THICKNESS DISTRIBUTION | | | | |
| AVERAGE THICKNESS (Å) | 0.42 | 6.06 | 20.37 | 6.15 |
| WiW(±%) | 40.89 | 11.19 | 14.80 | 71.23 |

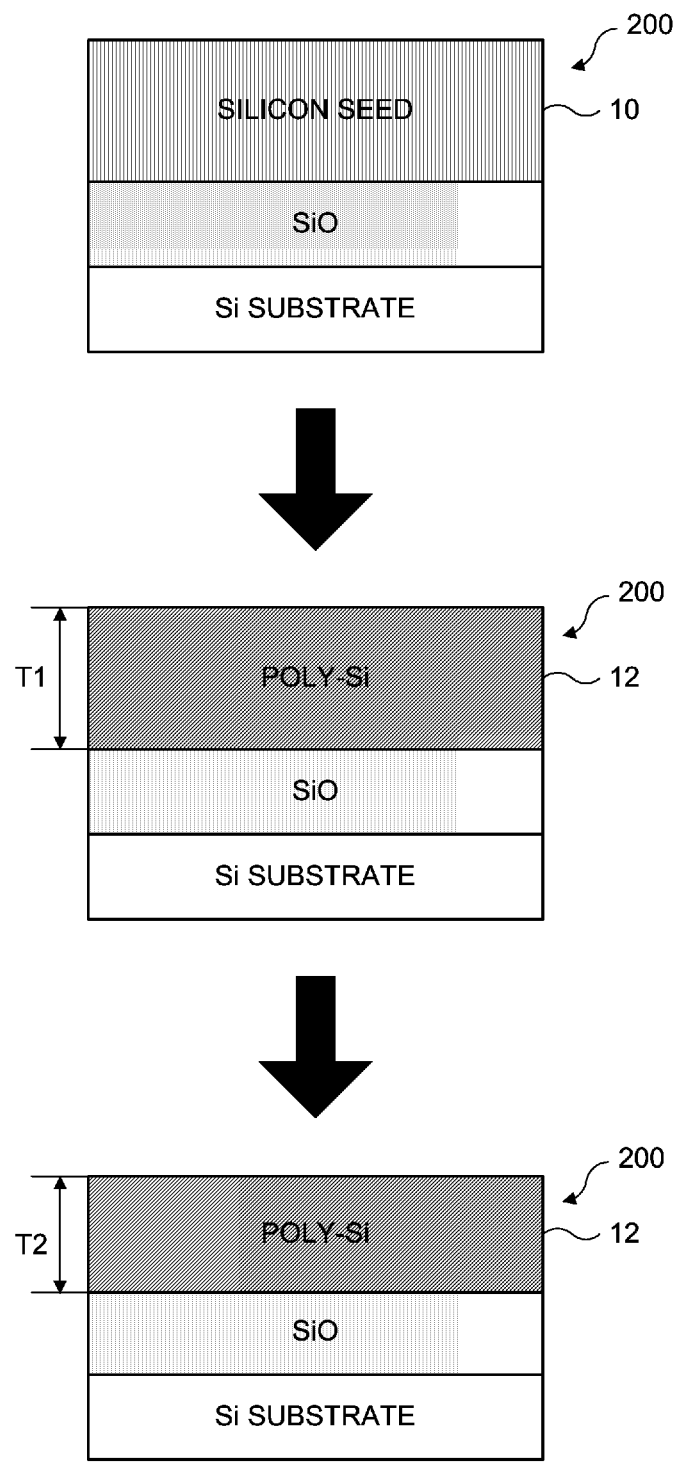

FIG. 8

|  | EMBODIMENTS (WITH ANNEALING PROCESS) | COMPARATIVE EXAMPLE (WITHOUT ANNEALING PROCESS) |
|---|---|---|
| THICKNESS BEFORE DHF ETCHING [Å] | 62.6 | 59.3 |
| THICKNESS AFTER DHF ETCHING [Å] | 59.9 | 0.4 |
| ETCHED AMOUNT [Å] | 2.7 | 58.9 |

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application is a continuation of International Application No. PCT/JP2016/077698, filed on Sep. 20, 2016, the entire contents of which are hereby incorporated by reference.

TECHNICAL FIELD

The present disclosure relates to a method of manufacturing a semiconductor device, a substrate processing apparatus and a non-transitory computer-readable recording medium

BACKGROUND

As one of manufacturing processes of a semiconductor device, a process of forming an oxide film on a substrate accommodated in a process vessel by supplying a source gas and a reactive gas having a strong oxidizing power. When the substrate is processed, the oxidizing power of the reaction gas may adversely affect a base film (underlying film) of the oxide film.

SUMMARY

Described herein is a technique capable of suppressing an adverse effect of a reactive gas on a base film.

According to one of embodiments of the present disclosure, there is provided a technique that includes: (a) forming a seed layer in an amorphous state on a substrate by supplying a source gas to the substrate; (b) polycrystallizing the seed layer by processing the seed layer by heat; and (c) performing a cycle a predetermined number of times to form an oxide film on a polycrystallized seed layer and to oxidize the polycrystallized seed layer, the cycle including: (c-1) supplying the source gas to the substrate; and (c-2) supplying an oxygen-containing gas and a hydrogen-containing gas to the substrate, wherein (c-1) and (c-2) are non-simultaneously performed.

BRIEF DESCRIPTION OF THE DRAWINGS

FIG. 8 illustrates an etched amount of the wafer when the annealing step is performed as shown in FIG. 7A and an etched amount of the wafer when the annealing step is not performed as shown in FIG. 7B.

DETAILED DESCRIPTION

Embodiments

Figure 1:
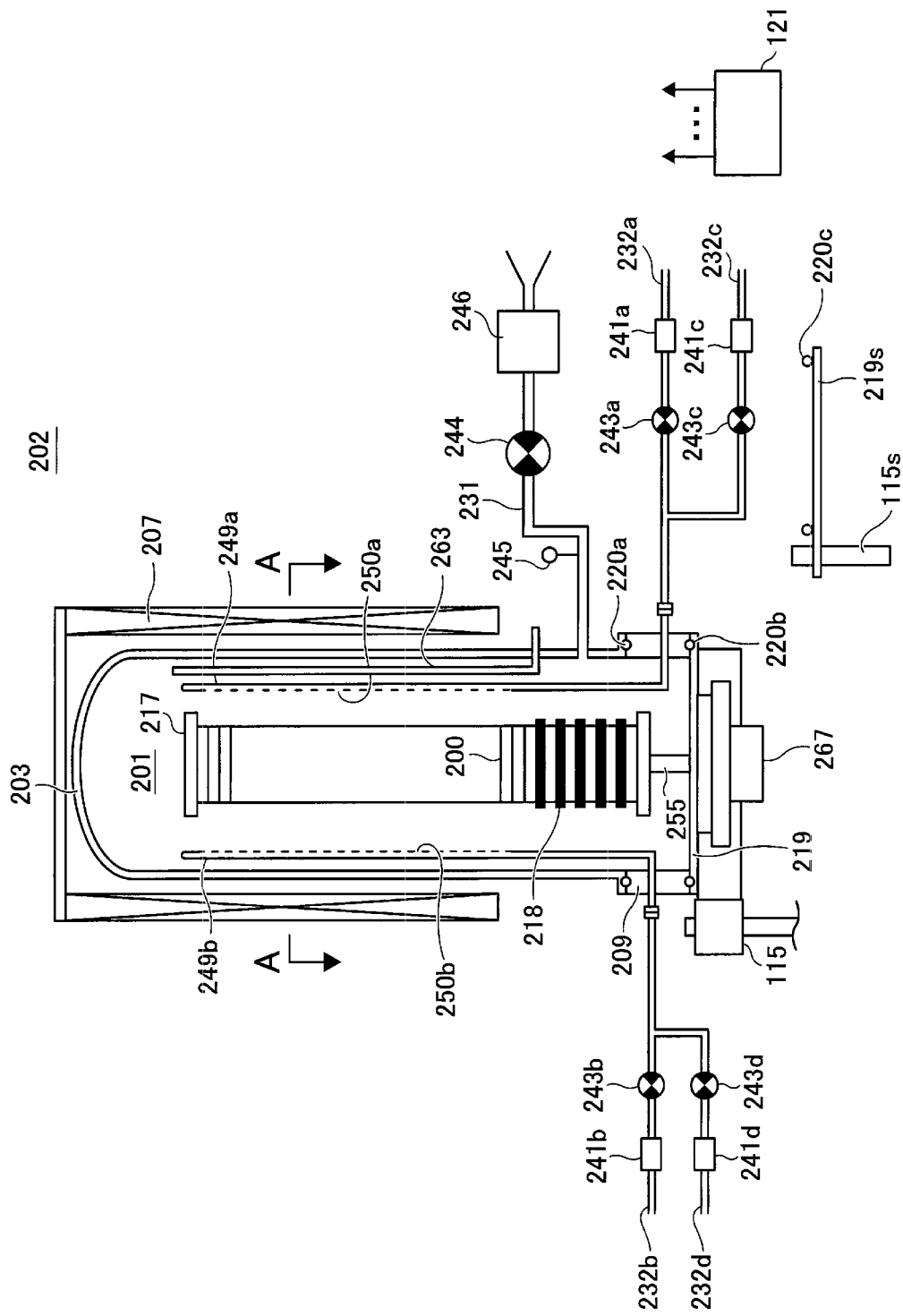
FIG. 1 schematically illustrates a vertical cross-section of a vertical type process furnace of a substrate processing apparatus preferably used in one or more embodiments described herein.

Hereinafter, one or more embodiments according to the technique will be described with reference to FIGS. 1 through 3.

(1) Configuration of Substrate Processing Apparatus

A substrate processing apparatus preferably used in one or more embodiments described herein includes a process furnace (vertical type process furnace) 202. The process furnace 202 is provided with a heater 207 serving as a heating apparatus (heating mechanism). The heater 207 is cylindrical, and is vertically installed while being supported by a support plate. The heater 207 also functions as an activation mechanism (excitation mechanism) for activating (exciting) a gas by heat.

A reaction tube 203 is provided inside of the heater 207 so as to be concentric with the heater 207. The reaction tube 203 is installed to be perpendicular to the heater 207 while being supported by a manifold 209. The reaction tube 203 is made of a heat resistant material such as quartz ($SiO_2$), and is cylindrical with a closed upper end and an open lower end. The manifold 209 is made of a metal such as stainless steel (SUS), and is cylindrical with open upper and lower ends. The upper end of the manifold 209 is engaged with the lower end of the reaction tube 203 so as to support the reaction tube 203. An O-ring 220a serving as a sealing part is provided between the upper end of the manifold 209 and the reaction tube 203. A process vessel (reaction vessel) is constituted mainly by the reaction tube 203 and the manifold 209. A process chamber 201 is provided in a hollow cylindrical portion of the process vessel. The process chamber 201 is configured to accommodate wafers including a wafer 200 serving as a substrate.

Nozzle 249a and 249b are provided in the process chamber 201 through a sidewall of the manifold 209. The nozzle 249a serves as a first nozzle and a nozzle 249b serves as a second nozzle. Gas supply pipes 232a and 232b are connected to the nozzles 249a and 249b, respectively.

Mass flow controllers (MFCs) 241a and 241b serving as flow rate controllers (flow rate control mechanisms) and valves 243a and 243b serving as opening/closing valves are sequentially installed at the gas supply pipes 232a and 232b, respectively, from the upstream sides to the downstream sides of the gas supply pipes 232a and 232b. Gas supply pipes 232c and 232d configured to supply an inert gas are connected to the gas supply pipes 232a and 232b at the downstream sides of the valves 243a and 243b, respectively. MFCs 241c and 241d and valves 243c and 243d are sequentially installed at the gas supply pipes 232c and 232d, respectively, from the upstream sides to the downstream sides of the gas supply pipes 232c and 232d.

Figure 2:
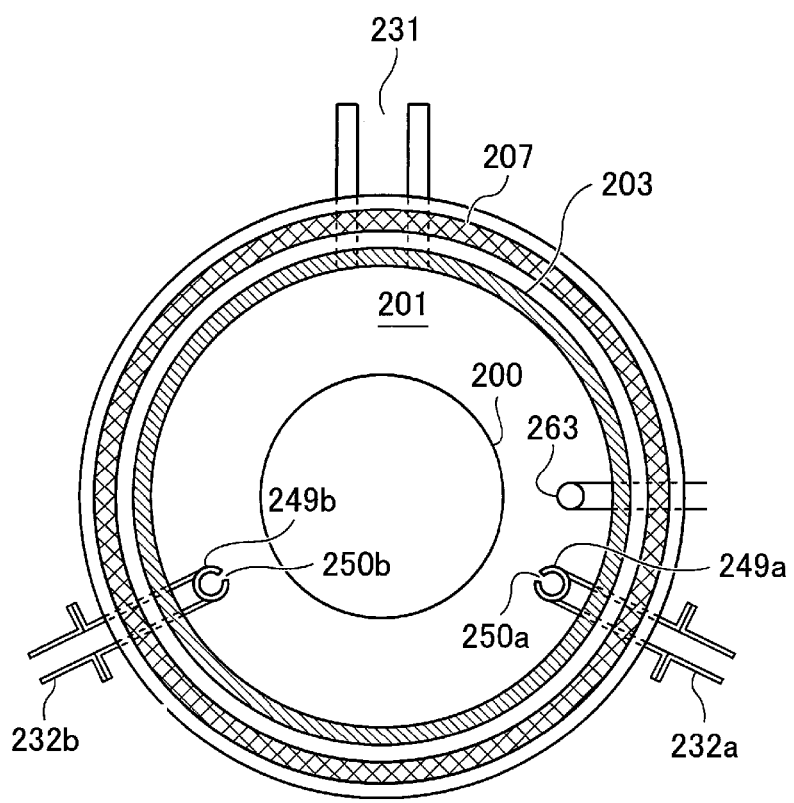
FIG. 2 schematically illustrates a cross-section taken along the line A-A of the vertical type process furnace of the substrate processing apparatus shown in FIG. 1.

As shown in FIG. 2, the nozzles 249a and 249b are provided in an annular space between an inner wall of the reaction tube 203 and the wafers including the wafer 200 accommodated in the process chamber 201, and extend from a lower portion of the inner wall of the reaction tube 203 to an upper portion of the inner wall of the reaction tube 203 along a stacking direction of the wafers, respectively. That is, the nozzles 249a and 249b are provided in a region that horizontally surrounds a wafer arrangement region at one side of the wafer arrangement region where the wafers are arranged along the stacking direction of the wafers. A plurality of gas supply holes 250a and a plurality of gas supply holes 250b configured to supply the gases are provided at side surfaces of the nozzles 249a and 249b, respectively. The plurality of gas supply holes 250a and the plurality of gas supply holes 250b are open toward the center of the reaction tube 203, and are configured to supply the gases toward the wafers, respectively. The plurality of gas supply holes 250a and the plurality of gas supply holes 250b are provided from the lower portion of the reaction tube 203 to the upper portion thereof, respectively.

A source gas containing a predetermined element is supplied to the process chamber 201 through the gas supply pipe 232a provided with the MFC 241a and the valve 243a and the nozzle 249a. For example, a halosilane source gas containing silicon (Si) as the predetermined element and a halogen element may be supplied to the process chamber 201.

The source gas may refer to a source in gaseous state under normal temperature and normal pressure (atmospheric pressure) or a gas obtained by vaporizing a source in liquid state under normal temperature and normal pressure. A halosilane source refers to a silane source containing a halogen group such as chloro group, fluoro group, bromo group and iodo group. That is, the halogen group includes a halogen element such as chlorine (Cl), fluorine (F), bromine (Br) and iodine (I). The halosilane source may be considered as a halide.

As the halosilane source gas, for example, a source gas containing silicon and chlorine, that is, a chlorosilane source gas may be used. As the chlorosilane source gas, for example, an inorganic chlorosilane source gas such as hexachlorodisilane ($Si_2Cl_6$, abbreviated as HCDS) gas may be used. In other words, the HCDS gas is a source gas containing at least two silicon atoms and a chlorine atom in a molecule and including silicon and silicon (Si—Si) bonds. The gas described above such as the halosilane source gas serves as a silicon source. When a liquid source in a liquid state under normal temperature and normal pressure such as the HCDS is used as the source gas, the liquid source is vaporized by a vaporization system (not shown) such as a vaporizer or a bubbler, and then is supplied as the source gas such as the HCDS gas.

A first reactive gas having a different chemical structure (molecular structure) from the source gas is supplied into the process chamber 201 through the gas supply pipe 232b provided with the MFC 241b and the valve 243b and the nozzle 249b. For example, an oxygen (O)-containing gas may be used as the first reactive gas. The oxygen-containing gas serves as an oxidation gas, that is, an oxygen source in a film-forming process described later. For example, a gas such as oxygen gas ($O_2$ gas) may be used as the oxygen-containing gas.

A second reactive gas having a different chemical structure from the source gas, is supplied into the process chamber 201 through the gas supply pipe 232a provided with the MFC 241a and the valve 243a and the nozzle 249a. For example, a hydrogen (H)-containing gas may be used as the second reactive gas. It is difficult to obtain an oxidizing effect (or power) only with the hydrogen-containing gas. However, in the film-forming process described later, by reacting the hydrogen-containing gas with the oxygen-containing gas under specific conditions, an oxidizing species such as an atomic oxygen (O) may be generated. Thus, the hydrogen-containing gas acts to improve the efficiency of an oxidation process. Therefore, like the oxygen-containing gas, the hydrogen-containing gas may also be considered as the oxidation gas. For example, a gas such as hydrogen gas ($H_2$ gas) may be used as the hydrogen-containing gas. In the present specification, the first reactive gas and the second reactive gas may be collectively referred to as a "reactive gas". Alternatively, only one of the first reactive gas and the second reactive gas may be individually referred to as a "reactive gas".

An inert gas such as nitrogen gas ($N_2$ gas) is supplied into the process chamber 201 through the gas supply pipe 232c and 232d provided with the MFCs 241c and 241d and the valves 243c and 243d, respectively, and the nozzles 249a and 249b.

A source gas supply system is constituted mainly by the gas supply pipe 232a, the MFC 241a and the valve 243a. An oxygen-containing gas supply system is constituted mainly by the gas supply pipe 232b, the MFC 241b and the valve 243b. A hydrogen-containing gas supply system is constituted mainly by the gas supply pipe 232a, the MFC 241a and the valve 243a. An inert gas supply system is constituted mainly by the gas supply pipes 232c and 232d, the MFCs 241c and 241d and the valves 243c and 243d.

Any one or all of the above-described gas supply systems may be embodied as an integrated gas supply system (not shown) in which the components such as the valves 243a through 243d and the MFCs 241a through 241d are integrated. The integrated gas supply system is connected to the respective gas supply pipes 232a through 232d. An operation of the integrated gas supply system to supply various gases to the gas supply pipes 232a through 232d, for example, operations such as an operation of opening/closing the valves 243a through 243d and an operation of adjusting flow rates of the gases through the MFCs 241a through 241d may be controlled by a controller 121 which will be described later. The integrated gas supply system may be embodied as an integrated mechanism (integrated unit) having an all-in-one structure or a divided structure. The integrated gas supply system may be attached to or detached from the components such as the gas supply pipes 232a through 232d on a basis of the integrated mechanism. Operations such as maintenance, replacement and addition of the integrated gas supply system may be performed on a basis of the integrated mechanism.

An exhaust pipe 231 configured to exhaust an inner atmosphere of the process chamber 201 is provided at the reaction tube 203. A vacuum pump 246 serving as a vacuum exhausting apparatus is connected to the exhaust pipe 231 through a pressure sensor 245 and an APC (Automatic Pressure Controller) valve 244. The pressure sensor 245 serves as a pressure detector (pressure detection mechanism) to detect an inner pressure of the process chamber 201, and the APC valve 244 serves as an exhaust valve (pressure adjusting mechanism). With the vacuum pump 246 in operation, the APC valve 244 may be opened or closed to vacuum-exhaust the process chamber 201 or stop the vacuum exhaust. With the vacuum pump 246 in operation, an opening degree of the APC valve 244 may be adjusted based on the pressure detected by the pressure sensor 245, in order to control the inner pressure of the process chamber 201. An exhaust system is constituted mainly by the exhaust pipe 231, the APC valve 244 and the pressure sensor 245. The exhaust system may further include the vacuum pump 246.

A seal cap 219 serving as a furnace opening cover capable of airtightly sealing a lower end opening of the manifold 209 is provided under the manifold 209. The seal cap 219 is made of a metal such as SUS (stainless steel), and is disk-shaped. An O-ring 220b serving as a sealing part is provided on an upper surface of the seal cap 219 so as to be in contact with the lower end of the manifold 209. A rotating mechanism 267 configured to rotate a boat 217 described later is provided under the seal cap 219. A rotating shaft 255 of the rotating mechanism 267 is connected to the boat 217 through the seal cap 219. As the rotating mechanism 267 rotates the boat 217, the wafers including the wafer 200 supported by the boat 219 are rotated. A boat elevator 115 serving as an elevating mechanism is provided at the outside the reaction tube 203 vertically. The seal cap 219 may be elevated or lowered in the vertical direction by the boat elevator 115. When the seal cap 219 is moved elevated or lowered by the boat elevator 115, the boat 217 placed on the seal cap 219 may be loaded into the process chamber 201 or unloaded out of the process chamber 201. The boat elevator 115 serves as a transfer device (transfer mechanism) that loads the boat 217, that is, the wafers accommodated in the boat 217 into the process chamber 201 or unloads the boat 217, that is, the wafers accommodated in the boat 217 out of the process chamber 201. A shutter 219s serving as a furnace opening cover capable of airtightly sealing the lower end opening of the manifold 209 is provided under the manifold 209. The shutter 219s is configured to close the lower end opening of the manifold 209 while the seal cap 219 is lowered by the boat elevator 115. The shutter 219s is made of a metal such as SUS (stainless steel), and is disk-shaped. An O-ring 220c serving as a sealing part is provided on an upper surface of the shutter 219s so as to be in contact with the lower end of the manifold 209. The opening/closing operation of the shutter 219s such as the elevation and the rotation of the shutter 219s is controlled by a shutter opening/closing mechanism 115s.

The boat 217 serving as a substrate retainer aligns the wafers including the wafer 200, for example, from 25 to 200 wafers in the vertical direction and supports the wafers, while the wafers are horizontally oriented with their centers aligned with each other. That is, the boat 217 supports (accommodates) the wafers with predetermined intervals therebetween. The boat 217 is made of a heat resistant material such as quartz and silicon carbide (SiC). Insulating plates 218 are provided in multiple stages under the boat 217. The insulating plates 218 are made of a heat-resistant material such as quartz and SiC.

A temperature sensor 263 serving as a temperature detector is provided in the reaction tube 203. The state of electric conduction to the heater 207 is adjusted based on the temperature detected by the temperature sensor 263, such that an inner temperature of the process chamber 201 has a desired temperature distribution. The temperature sensor 263 is provided along the inner wall of the reaction tube 203.

Figure 3:
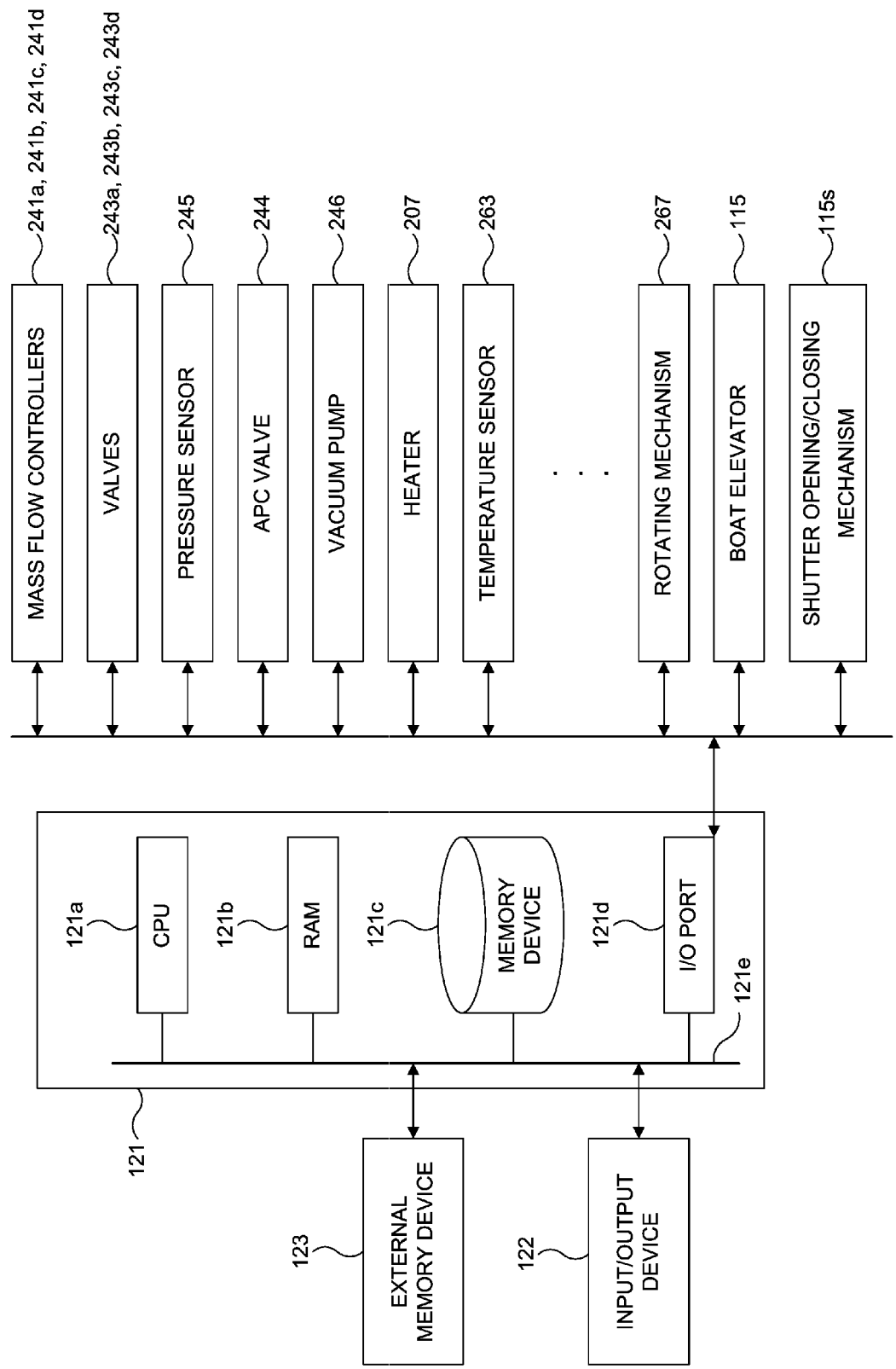
FIG. 3 is a block diagram schematically illustrating a configuration of a controller and components controlled by the controller of the substrate processing apparatus preferably used in the embodiments.

As shown in FIG. 3, the controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). For example, a control program for controlling the operation of the substrate processing apparatus, a process recipe containing information on the sequences and the conditions of a substrate processing (film-forming process) described later are readably stored in the memory device 121c. The process recipe is obtained by combining steps of the substrate processing (film-forming process) described later such that the controller 121a can execute the steps to acquire a predetermine result, and functions as a program. Hereafter, the process recipe and the control program are collectively referred to as a "program". In the present specification, "program" may indicate only the process recipe, indicate only the control program, or indicate both of the process recipe and the control program. The RAM 121b is a memory area (work area) where a program or data read by the CPU 121a is temporarily stored.

The I/O port 121d is connected to the above-described components such as the mass flow controllers (MFCs) 241a, 241b, 241c and 241d, the valves 243a, 243b, 243c and 243d, the pressure sensor 245, the APC valve 244, the vacuum pump 246, the heater 207, the temperature sensor 263, the rotating mechanism 267, the boat elevator 115 and the shutter opening/closing mechanism 115s.

The CPU 121a is configured to read the control program from the memory device 121c and execute the read control program. Furthermore, the CPU 121a is configured to read a recipe such as the process recipe from the memory device 121c according to an operation command inputted from the input/output device 122. According to the contents of the read recipe, the CPU 121a may be configured to control various operations such as flow rate adjusting operations for various gases by the MFCs 241a, 241b, 241c and 241d, opening/closing operations of the valves 243a, 243b, 243c and 243d, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, a rotation operation and rotation speed adjusting operation of the boat 217 by the rotating mechanism 267, an elevating and lowering operation of the boat 217 by the boat elevator 1115, and an opening/closing operation of the shutter 219s by the shutter opening/closing mechanism 115s.

The controller 121 may be embodied by installing the above-described program stored in an external memory device 123 into a computer. For example, the external memory device 123 may include a magnetic tape, a magnetic disk such as a flexible disk and a hard disk, an optical disk such as a CD and a DVD, a magneto-optical disk such as MO, a semiconductor memory such as a USB memory and a memory card. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Substrate Processing

Hereinafter, an exemplary sequence of the substrate processing (film-forming process) of forming a film on the wafer 200 serving as a substrate, which is a part of manufacturing processes of a semiconductor device, will be described with reference to FIGS. 4 and 5. The exemplary sequence is performed by using the above-described substrate processing apparatus. Hereinafter, the components of the substrate processing apparatus are controlled by the controller 121.

Figure 4:
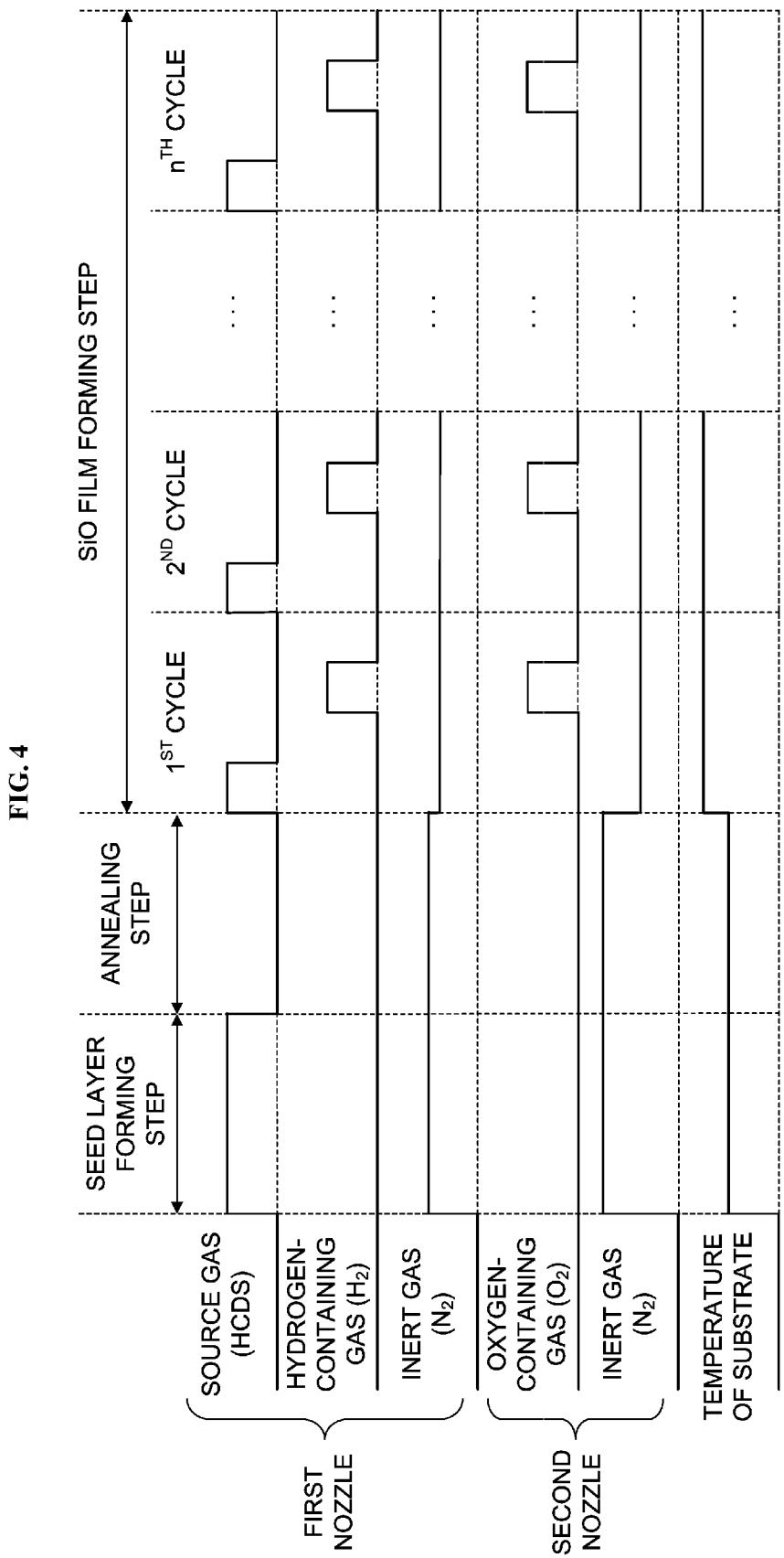
FIG. 4 illustrates an exemplary film-forming sequence according to one or more embodiments described herein.

The exemplary sequence of the film-forming process shown in FIG. 4 includes: (a) forming a seed layer in an amorphous state on the wafer 200 accommodated in the process vessel by supplying the HCDS gas to the wafer 200; (b) polycrystallizing the seed layer by processing the seed layer by heat; and (c) performing a cycle a predetermined number of times (n times) to form a silicon oxide film (SiO2 film, hereinafter, the silicon oxide film may also be simply referred to as an "SiO film" or an "SiO layer") serving as a oxygen-containing film on the polycrystallized seed layer and to oxidize the polycrystallized seed layer, the cycle including: (c-1) supplying the HCDS gas to the wafer 200 accommodated in the process vessel; and (c-2) supplying the O2 gas and the H2 to the wafer 200 accommodated in the process vessel, wherein (c-1) and (c-2) are non-simultaneously performed.

In the present specification, the term "wafer" may refer to "a wafer itself" or refer to "a wafer and a stacked structure (aggregated structure) of predetermined layers or films formed on a surface of the wafer". In addition, "surface of a wafer" may refer to "a surface of a wafer itself" or refer to "a surface of a predetermined layer or film formed on a wafer". Thus, in the present specification, "forming a predetermined layer (or film) on a wafer" may refer to "forming a predetermined layer (or film) on a surface of a wafer itself" or refer to "forming a predetermined layer (or film) on a surface of a layer or a film formed on a wafer". In the present specification, "substrate" and "wafer" may be used as substantially the same meaning.

Substrate Charging and Boat Loading Step

The wafers including the wafer 200 are charged (transferred) into the boat 217 (substrate charging step). After the boat 217 is charged with the wafers, the shutter 219s is moved by the shutter opening/closing mechanism 115s to open the lower end opening of the manifold 209. Then, the boat 217 charged with the wafers is elevated by the boat elevator 115 and loaded into the process chamber 201 (boat loading step). With the boat 217 loaded, the seal cap 209 seals the lower end opening of the manifold 209 via the O-ring 220b.

Pressure and Temperature Adjusting Step

The vacuum pump 246 vacuum-exhausts the process chamber 201 in which the wafers including the wafer 200 are accommodated until the inner pressure of the process chamber 201 reaches a desired pressure (vacuum degree). The vacuum pump 246 continuously vacuum-exhausts the process chamber 201 until at least the processing of the wafer 200 is completed. The heater 207 heats the process chamber 201 until the temperature of the wafer 200 in the process chamber 201 reaches a desired temperature (that is, a film-forming temperature). The heater 207 continuously heats the process chamber 201 until at least the processing of the wafer 200 is completed. The rotating mechanism 267 rotates the boat 217. As the rotating mechanism 267 rotates the boat 217, the wafers supported by the boat 217 are rotated. The rotating mechanism 267 continuously rotates the boat 217 and the wafers until at least the processing of the wafer 200 is completed.

Film-Forming Process

Thereafter, the film-forming process is performed by performing a seed layer forming step, an annealing step (hereinafter, also referred to as a "polycrystallization step") and a silicon oxide film forming step ((hereinafter, also referred to simply as an "SiO film forming step") sequentially.

Seed Layer Forming Step

HCDS gas is supplied to the wafer 200 in the process chamber 201. Specifically, the valve 243a is opened to supply the HCDS gas into the gas supply pipe 232a. The flow rate of the HCDS gas supplied into the gas supply pipe 232a is adjusted by the MFC 241a. The HCDS gas having the flow rate thereof adjusted is then supplied to the wafer 200 in the process chamber 201 through the nozzle 249a, and is exhausted through the exhaust pipe 231. In the seed layer forming step, simultaneously, the valve 243c is opened to supply the inert gas such as $N_2$ gas through the gas supply pipe 232c. After the flow rate of the $N_2$ gas is adjusted by the MFC 241c, the $N_2$ gas having the flow rate thereof adjusted is supplied into the process chamber 201 with the HCDS gas, and is exhausted through the exhaust pipe 231.

In order to prevent the HCDS gas from entering the nozzle 249b, the valve 243d is opened to supply the $N_2$ gas into the gas supply pipe 232d. The $N_2$ gas supplied into the process chamber 201 through the gas supply pipe 232b and the nozzle 249b, and is exhausted through the exhaust pipe 231.

In the seed layer forming step, for example the inner pressure of the process chamber 201 is adjusted to a predetermined pressure ranging from 300 Pa to 1,000 Pa. For example, the inner pressure of the process chamber 201 may be adjusted to 399 Pa. When the inner pressure of the process chamber 201 is lower than 300 Pa, a seed layer such as a silicon seed layer 10 described later may not be adsorbed on the wafer 200. When the inner pressure of the process chamber 201 is higher than 1,000 Pa, a large amount of adherence may occur to an inside of the nozzle, so that particles may be generated easily. For example, by adjusting the inner pressure of the process chamber 201 to the predetermined pressure ranging from 300 Pa to 1,000 Pa as described above, it is possible to improve the quality of the film-forming process.

In the seed layer forming step, for example, the flow rate of the HCDS gas is adjusted by the MFC 241a to a predetermined flow rate ranging from 100 sccm to 400 sccm. For example, the flow rate of the HCDS gas may be adjusted to 200 sccm. For example, the flow rate of the $N_2$ gas is adjusted by the MFC 241c to a predetermined flow rate ranging from 300 sccm to 800 sccm. For example, the flow rate of the $N_2$ gas may be adjusted to 500 sccm by the MFC 241c. For example, the flow rate of the $N_2$ gas is adjusted by the MFC 241d to a predetermined flow rate ranging from 500 sccm to 1,500 sccm. For example, the flow rate of the $N_2$ gas may be adjusted to 1,000 sccm by the MFC 241d. For example, the time duration (also referred to as a "supply time") of supplying the HCDS gas to the wafer 200 may range from 5 minutes to 30 minutes. For example, the time duration of supplying the HCDS may be set to 10 minutes. When the time duration of supplying the HCDS gas is shorter than 5 minutes, the seed layer to be formed on the wafer 200 may become thinner and a surface of the seed layer may become rough (that is, the roughness may be deteriorated). When the time duration of supplying the HCDS gas is longer than 30 minutes, the throughput of the film-forming process may decrease. For example, by adjusting the time duration of supplying the HCDS gas within a range of 5 minutes to 30 minutes, it is possible to reliably secure (maintain) the quality of the film-forming process and the throughput of the film-forming process.

In the seed layer forming step, for example, the inner temperature of the process chamber 201 (that is, a film-forming temperature) is adjusted to a predetermined temperature ranging from 300° C. to 550° C., preferably from 400° C. to 550° C. For example, the inner temperature of the process chamber 201 may be adjusted to 500° C. When the film-forming temperature is lower than 300° C., the seed layer may not be adsorbed on the wafer 200. When the film-forming temperature is higher than 550° C., the seed layer may be scraped by the action of chlorine (Cl) component contained in the source gas, and as a result, the uniformity of the seed layer on the surface of the wafer 200 may be deteriorated. For example, by adjusting the film-forming temperature within a range of 300° C. to 550° C., it is possible to reliably secure (maintain) the uniformity of the seed layer on the surface of the wafer 200 and the practical level of the film-forming rate (deposition rate). For example, by adjusting the film-forming temperature within a range of 400° C. to 550° C., it is possible to improve the uniformity of the seed layer on the surface of the wafer 200 and the film-forming rate.

Figure 5A:
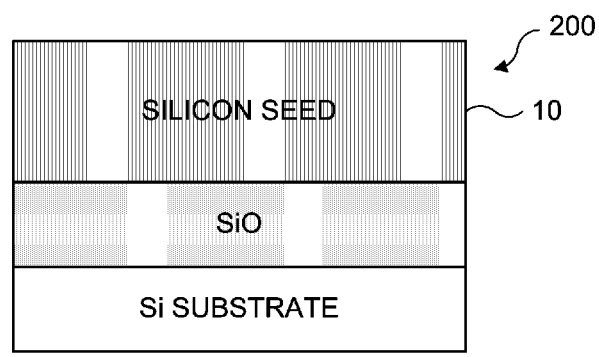
FIG. 5A schematically illustrates a vertical cross-section of a wafer after a seed layer forming step is performed on the wafer, FIG. 5B schematically illustrates a vertical cross-section of the wafer after an annealing step is performed on the wafer shown in FIG. 5A, and FIG. 5C schematically illustrates a vertical cross-section of the wafer after a silicon oxide film forming step is performed on the wafer shown in FIG. 5B.
Figure 5A:
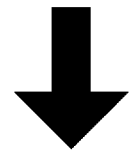

By supplying the HCDS gas to the wafer 200 under the above-described conditions, as shown in FIG. 5A, the amorphous silicon seed layer 10 serving as the seed layer (indicated by "SILICON SEED" in FIG. 5A) containing silicon and chlorine having a thickness of, for example, about 5 Å to 50 Å is formed on the outermost surface of the wafer 200 such as a silicon wafer (indicated by "Si SUBSTRATE" in FIG. 5A) on which a base film (hereinafter, also referred to as an "underlying film") such as an SiO film (indicated by "SiO" in FIG. 5A) is formed. The thickness of the silicon seed layer 10 is set to be equal to or greater than a reference thickness. The reference thickness may refer to a thickness of the silicon seed layer 10 when a crystallized polysilicon layer (hereinafter, also referred to simply as a "poly-Si layer") 12 obtained by modifying the silicon seed layer 10 in the annealing step is entirely oxidized to an SiO film 14 in the SiO film forming step. When the thickness of the silicon seed layer 10 is less than the reference thickness, the oxidation gas may reach the base film and the base film may be oxidized. When the silicon seed layer 10 can substantially prevent the oxidation of the base film, the reference thickness may be slightly less than the thickness of the silicon seed layer 10 when the crystallized poly-Si layer 12 obtained by modifying the silicon seed layer 10 in the annealing step is entirely oxidized to the SiO film 14 in the SiO film forming step.

After the silicon seed layer 10 is formed, the valve 243a is closed to stop the supply of the HCDS gas into the process chamber 201. With the APC valve 244 open, the vacuum pump 246 vacuum-exhausts the inside of the process chamber 201 to remove a residual HCDS gas in the process chamber 201 which did not react or which contributed to the formation of the silicon seed layer 10 from the process chamber 201. By maintaining the valves 243c and 243d open, the $N_2$ gas is continuously supplied into the process chamber 201. The $N_2$ gas serves as a purge gas.

Instead of the HCDS gas, for example, dichlorosilane ($SiH_2Cl_2$, abbreviated as DCS) gas may be used as the source gas.

Instead of the $N_2$ gas, for example, rare gases such as argon (Ar) gas, helium (He) gas, neon (Ne) gas and xenon (Xe) gas may be used as the inert gas.

Annealing Step (Polycrystallization Step)

Thereafter, the inner temperature of the process chamber 201 is elevated so as to be higher than that of the process chamber 201 in the seed layer forming step described above. In the annealing step, the $N_2$ gas is continuously supplied to the wafer 200. As described above, an annealing process (heat treatment process) is performed in the process chamber 201 in an $N_2$ gas atmosphere while the inner temperature of the process chamber 201 is maintained higher than that of the process chamber 201 in the seed layer forming step. For example, in the annealing step, the inner temperature of the process chamber 201 is adjusted to a predetermined temperature ranging from 600° C. to 900° C., preferably from 600° C. to 750° C. For example, in the annealing step, the inner temperature of the process chamber 201 may be adjusted to 600° C.

In the annealing step, the flow rate of the $N_2$ gas is adjusted by the MFC 241c to a predetermined flow rate ranging from 300 sccm to 800 sccm. For example, the flow rate of the $N_2$ gas may be adjusted to 500 sccm by the MFC 241c. The flow rate of the $N_2$ gas is adjusted by the MFC 241d to a predetermined flow rate ranging from 500 sccm to 1,500 sccm. For example, the flow rate of the $N_2$ gas may be adjusted to 1,000 sccm by the MFC 241d. A processing time of the annealing step may range from 60 minutes to 120 minutes. For example, the processing time of the annealing step may be set to 60 minutes. When the processing time of the annealing step is shorter than 60 minutes, the silicon seed layer 10 may not be sufficiently polycrystallized. When the processing time of the annealing step is longer than 120 minutes, the throughput of the film-forming process may decrease.

Figure 5B:
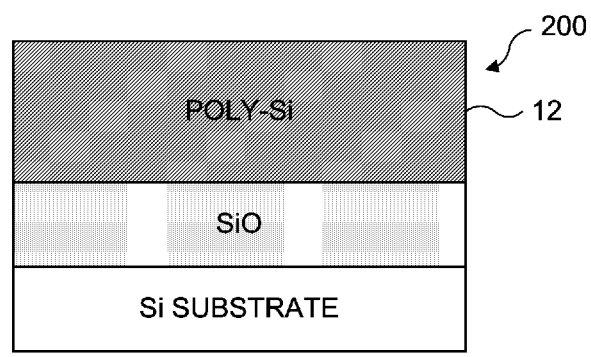
Figure 5B:
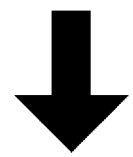

By supplying the $N_2$ gas to the wafer 200 accommodated in the process chamber 201 under the above-described conditions, the silicon seed layer 10 on the outermost surface of the wafer 200 is processed by heat and the impurities such as chlorine in the silicon seed layer 10 are desorbed from the silicon seed layer 10. As a result, as shown in FIG. 5B, the silicon seed layer 10 is polycrystallized and modified into the polysilicon layer (poly-Si layer) 12 having a thickness of, for example, about 5 Å to 50 Å. By forming the silicon seed layer 10 on the base film, it is possible to suppress the oxidation of the base film by the oxidation gas when the SiO film 14 described later is formed in the SiO film forming step. By polycrystallizing the silicon seed layer 10 into the poly-Si layer 12, it is possible to improve the roughness and the electrical characteristics.

SiO Film Forming Step

Thereafter, the SiO film forming step is performed by performing a first step and a second step sequentially.

First Step

In the first step, the HCDS gas is supplied to the wafer 200 in the process chamber 201. In the first step, the opening and closing of valves 243a through 243d are controlled in the same manners as those of the valves 243a through 243d in the seed layer forming step.

In the first step, the inner pressure of the process chamber 201 is adjusted to a predetermined pressure ranging from 1 Pa to 1,000 Pa, preferably, from 67 Pa to 1,000 Pa, more preferably, from 133 Pa to 1,000 Pa. For example, the inner pressure of the process chamber 201 may be adjusted to 399 Pa.

In the first step, for example, the flow rate of the HCDS gas is adjusted to a predetermined flow rate ranging from 1 sccm to 2,000 sccm, preferably, from 10 sccm to 1,000 sccm. For example, the flow rate of the HCDS gas may be adjusted to 200 sccm. The flow rates of the $N_2$ gas is adjusted to predetermined flow rates by the MFCs 241c and 241d. For example, the predetermined flow rates of the $N_2$ gas adjusted by the MFCs 241c and 241d may range from 100 sccm to 10,000 sccm, respectively. For example, the flow rates of the $N_2$ gas may be adjusted to 300 sccm by the MFCs 241c and 241d. The time duration of supplying the HCDS gas to the wafer 200 is adjusted to be shorter than the time duration of supplying the HCDS gas in the seed layer forming step. The time duration of supplying the HCDS gas in the first step may range from 1 second to 120 seconds, preferably, from 1 second to 60 seconds In the first step, the inner temperature of the process chamber 201 is maintained at a temperature equal to or higher than that of the process chamber 201 in the annealing step. For example, the inner temperature of the process chamber 201 may range from 600° C. to 900° C., preferably from 600° C. to 750° C. For example, the inner temperature of the process chamber 201 may be adjusted to 600° C. in the first step.

By supplying the HCDS gas to the wafer 200 under the above-described conditions, for example, a silicon-containing layer containing chlorine (Cl) having a thickness of, for example, less than one atomic layer to several atomic layers (or less than one molecular layer to several molecular layers) is formed as a first layer (initial layer) on the poly-Si layer 12 which is the outermost surface of the wafer 200. The first layer may include only the silicon-containing layer containing chlorine, only an adsorption layer of the HCDS, or both of them. The adsorption layer of the HCDS may include only a physical adsorption layer of the HCDS, only a chemical adsorption layer of the HCDS, or both of them.

In the present specification, "layer having a thickness of less than one atomic layer (or one molecular layer)" indicates an atomic layer (or molecular layer) which is discontinuously formed, and "layer having a thickness of one atomic layer (or molecular layer)" indicates an atomic layer (or molecular layer) which is continuously formed. The silicon-containing layer containing chlorine may indicate only the silicon-containing layer containing chlorine, only the adsorption layer of the HCDS, or both of them. For convenience of description, however, expressions such as "one atomic layer" and "several atomic layers" may be used for the silicon-containing layer containing chlorine. In addition, "atomic layer" and "molecular layer" may be used as substantially the same meaning in some cases.

Under conditions where the HCDS gas self-decomposes (thermally decomposes), the silicon layer containing chlorine is formed by the deposition of silicon on the wafer 200. Under conditions where the HCDS gas does not self-decompose (thermally decompose), the adsorption layer of the HCDS is formed by the adsorption of the HCDS on the wafer 200. When the silicon layer containing chlorine is formed on the wafer 200, the film-forming rate (deposition rate) can be increased more than that of the adsorption layer of the HCDS when the adsorption layer of HCDS is formed on the wafer 200. Hereafter, the silicon-containing layer containing chlorine may be simply referred to as a silicon-containing layer, for convenience of description.

After the first layer is formed on the wafer 200, the valve 243a is closed to stop the supply of the HCDS gas. With the APC valve 244 open, the vacuum pump 246 vacuum-exhausts the inside of the process chamber 201 to remove a residual HCDS gas in the process chamber 201 which did not react or which contributed to the formation of the first layer from the process chamber 201. By maintaining the valves 243c and 243d open, the $N_2$ gas is continuously supplied into the process chamber 201. The $N_2$ gas serves as the purge gas.

Second Step

After the first step is completed, oxygen gas ($O_2$ gas) and hydrogen gas ($H_2$ gas) are separately supplied into the process chamber 201 in the second step. Then, the $O_2$ gas and the $H_2$ gas are mixed and reacted in the process chamber 201.

In the second step, the valve 243a is opened to supply the $H_2$ gas into the gas supply pipe 232a and the valve 243b is opened to supply the $O_2$ gas into the gas supply pipe 232b, respectively. The flow rate of the $O_2$ gas is adjusted by the MFC 241b. The $O_2$ gas having the flow rate thereof adjusted is then supplied to the wafer 200 in the process chamber 201 through the nozzle 249b. The flow rate of the $H_2$ gas is adjusted by the MFC 241a. The $H_2$ gas having the flow rate thereof adjusted is then supplied to the wafer 200 in the process chamber 201 through the nozzle 249a. Then, the $O_2$ gas and the $H_2$ gas are mixed and reacted in the process chamber 201, and then are exhausted through the exhaust pipe 231. In the second step, the opening and closing of valves 243c and 243d are controlled in the same manners as those of the valves 243c and 243d in the first step.

In the second step, the inner pressure of the process chamber 201 is adjusted to a predetermined pressure lower than the atmospheric pressure. For example, the predetermined pressure may range from 1 Pa to 1,333 Pa. For example, the inner pressure of the process chamber 201 may be adjusted to 60 Pa in the second step.

In the second step, for example, the flow rate of the $O_2$ gas is be adjusted to a predetermined flow rate ranging from 1,000 sccm to 10,000 sccm. For example, the flow rate of the $O_2$ gas may be adjusted to 4,000 sccm. The flow rate of the $H_2$ gas is adjusted to a predetermined flow rate ranging from 100 sccm to 10,000 sccm. For example, the flow rate of the $H_2$ gas may be adjusted to 500 sccm. For example, the time duration of supplying the $O_2$ gas and the $H_2$ gas to the wafer 200 may range from 1 second to 120 minutes.

The other processing conditions are the same as the processing conditions of the first step, for example.

By supplying the $O_2$ gas and the $H_2$ gas to the wafer 200 under the above-described conditions, the $O_2$ gas and the $H_2$ gas are thermally activated (excited) in non-plasma under a heated and depressurized atmosphere and reacted, thereby an oxidizing species containing oxygen free of moisture ($H_2O$) such the atomic oxygen (O) is generated. Then, the first layer (silicon-containing layer) formed on the wafer 200 in the first step may be oxidized mainly by the oxidizing species. Since the energy of the oxidizing species described above is higher than the binding energies of the bonds such as silicon and chlorine (Si—Cl) bonds and silicon and hydrogen (Si—H) bonds contained in the silicon-containing layer, the bonds such as the Si—Cl bonds and the Si—H bonds contained in the silicon-containing layer are separated by the energy of the oxidizing species transferred to the silicon-containing layer. Components such as hydrogen (H) component and chlorine (Cl) component separated from the silicon (Si) component are removed from the film such as the silicon-containing layer, and then are discharged as gases such as chlorine gas ($Cl_2$ gas) and hydrogen chloride gas (HCl gas). In addition, the dangling bonds of silicon remaining after the components such as hydrogen component and chlorine component are separated are combined with oxygen (O) contained in the oxidizing species to form silicon and oxygen (Si—O) bonds.

As described above, the silicon-containing layer is changed (modified) into a silicon oxide layer (hereinafter, also referred to as a "SiO layer"). According to the oxidation of the silicon-containing layer as described above, it is possible to remarkably enhance the oxidizing power as compared with the case where the $O_2$ gas is supplied alone or the water vapor ($H_2O$) is supplied. That is, by adding the $H_2$ gas to the $O_2$ gas under the depressurized atmosphere, it is possible to further enhance the oxidizing power as compared with the case where the $O_2$ gas is supplied alone or when water vapor ($H_2O$) is supplied.

Since the oxidizing species described above has a strong oxidizing power, not only the first layer but also the film (base film) formed under the first layer may be oxidized. However, according to the embodiments, the poly-Si layer 12 is formed between the base film and the first layer. By oxidizing at least a part of the poly-Si layer 12 by the oxidizing species, it is possible to suppress the diffusion of the oxidizing species to the base film and to suppress the oxidation of the base film. By oxidizing at least a part of the poly-Si layer 12, at least the part of the poly-Si layer 12 is changed (modified) into a SiO layer of substantially the same quality as the second layer.

After the first layer (silicon-containing layer) is modified into the second layer (SiO layer), the valves 243a and 234b is closed to stop the supply of the $H_2$ gas and the $O_2$ gas into the process chamber 201.

Then, the inside of the process chamber 201 is vacuum-exhausted to remove the gas remaining in the process chamber 201 such as the $O_2$ gas and the $H_2$ gas and the reaction by-products from the process chamber 201 in the same manners as the first step. Similar to the first step, it is not necessary to completely remove the gas or the reaction by-products remaining in the process chamber 201.

Instead of the $O_2$ gas, a gas such as ozone ($O_3$) gas may be used as the oxygen-containing gas. Instead of the $H_2$ gas, a gas such as deuterium ($D_2$) gas may be used as the hydrogen-containing gas. For example, when an aminosilane source gas such as 4DMAS gas and 3DMAS gas is used as the source gas and the ozone ($O_3$) gas is used as the oxygen-containing gas, it is possible to perform the film-forming process with the sufficient (similar) film-forming rate.

Performing a Predetermined Number of Times

Figure 5C:
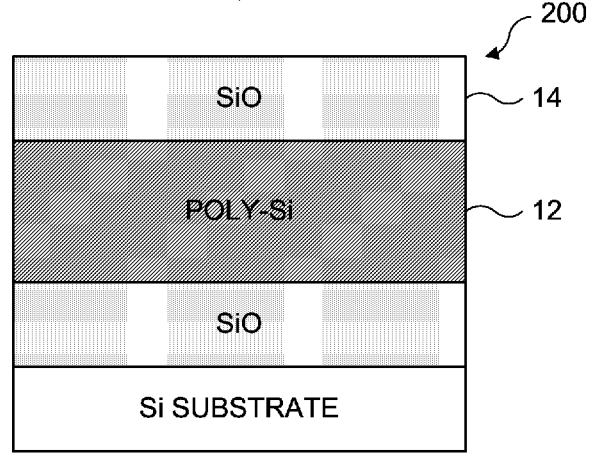

By performing a cycle wherein the first step and the second step are performed non-simultaneously in this order a predetermined number of times (at least once), the SiO film 14 having a desired thickness is formed on the wafer 200 as shown in FIG. 5C. It is preferable that the cycle is performed a plurality of times. That is, the cycle is performed (repeated) until a total thickness of the SiO film 14 reaches the desired thickness under the condition that the SiO layer formed in each cycle is thinner than the desired thickness, wherein the total thickness of the SiO film 14 is defined by a total of a thickness of an SiO film formed by stacking the SiO layer by performing the cycle a plurality of times and a thickness of an SiO film formed by oxidizing the poly-Si layer a plurality of times.

Purging and Returning to Atmospheric Pressure Step

After the SiO film 14 is formed, the $N_2$ gas is supplied into the process chamber 201 through each of the gas supply pipes 232c and 232d, and then the $N_2$ gas supplied into the process chamber 201 is exhausted through the exhaust pipe 231. The $N_2$ gas serves as the purge gas. The inside of the process chamber 201 is purged with the $N_2$ gas, thus the gas remaining in the process chamber 201 or the reaction by-products remaining in the process chamber 201 are removed from the process chamber 201 (purging step). Thereafter, the inner atmosphere of the process chamber 201 is replaced with the inert gas (substitution by inert gas), and the inner pressure of the process chamber 201 is returned to atmospheric pressure (returning to atmospheric pressure step).

Boat Unloading and Wafer Discharging Step

Thereafter, the seal cap 209 is lowered by the boat elevator 115 and the lower end of the manifold 209 is opened. The boat 217 with the processed wafers including the wafer 200 charged therein is unloaded out of the reaction tube 203 through the lower end of the manifold 209 (boat unloading step). Then, the processed wafers including the wafer 200 are then transferred (discharged) from the boat 217 (wafer discharging step).

(4) Effects According to the Embodiments

According to the embodiments described above, one or more advantageous effects described below can be achieved.

[1] By forming the silicon seed layer between the base film and the oxide film (SiO film), it is possible to suppress the oxidation of the base film. That is, by oxidizing the silicon seed layer by the oxidizing species having a strong oxidizing power, it is possible to suppress the diffusion of the oxidizing species to the base film below the silicon seed layer. Thus, it possible to suppress the oxidation of the base film and to improve the characteristics of the device (semiconductor device).

[2] By polycrystallizing the silicon seed layer, it is possible to improve the roughness and the electrical characteristics. Since the silicon seed layer is rough, the electrical characteristics may be deteriorated when the SiO film is formed on the upper surface of the silicon seed layer. However, according to the embodiments, since the roughness of the poly-Si layer is improved more than that of the silicon seed layer, it is possible to improve the electrical characteristics.

[3] By polycrystallizing the silicon seed layer, it becomes more difficult to oxidize the silicon seed layer than a case where the silicon seed layer is not polycrystallized. As a result, it is possible to reduce the thickness of the silicon seed layer formed between the base film and the SiO film when the silicon seed layer is polycrystallized. When the silicon seed layer and the poly-Si layer are exposed to the oxidizing species for the same time, respectively, an SiO film formed on the silicon seed layer becomes thicker than that of the poly-Si layer. Therefore, when the silicon seed layer is not polycrystallized, it is necessary to form a silicon seed layer thicker than the polycrystallized silicon seed layer between the base film and the SiO film. That is, the thickness of the silicon seed layer required to suppress the oxidation of the base film when the silicon seed layer is entirely oxidized to the SiO film is thicker than that of the poly-Si layer required to suppress the oxidation of the base film. In addition, the characteristics of the SiO film formed by oxidizing the silicon seed layer may be deteriorated as compared with the characteristics of the SiO film formed by oxidizing the poly-Si layer. By using the poly-Si layer, it is possible to reduce the thickness of the silicon seed layer formed between the base film and the SiO film. In addition, it is possible to improve the productivity of the film-forming process since the quality of the SiO film formed by oxidizing the poly-Si layer can be made substantially equal to the quality of the SiO film formed on the poly-Si layer.

[4] By polycrystallizing the silicon seed layer by processing the silicon seed layer by heat, it is possible to improve the density of the silicon seed layer. In addition, it is possible to reduce the impurities such as chlorine (Cl), hydrogen (H) and nitrogen (N). Therefore, it is possible to improve the quality of the silicon seed layer itself. The characteristics of the SiO film formed by oxidizing the poly-Si layer in the SiO film forming step can be made substantially equal to the characteristics of the SiO film formed in the SiO film forming step. Therefore, the SiO film formed by oxidizing the poly-Si layer has a good affinity with the SiO film formed in the SiO film forming step. In addition, it is possible to suppress the deterioration of the quality. Therefore, it is also possible to improve the device characteristics.

[5] By forming the silicon seed layer to have a thickness such that the polycrystallized silicon seed layer is substantially entirely oxidized in the SiO film forming step, it is possible to improve the performance of the device. At least a part of the polycrystallized silicon seed layer, that is, the poly-Si layer, is oxidized into the SiO film in the SiO film forming step. By setting the thickness of the silicon seed layer to the thickness such that the poly-Si layer is substantially entirely oxidized in the SiO film forming step, the silicon seed layer does not remain between the base film and the SiO film. Thereby, it is possible to maintain the function of the base film. In addition, since the silicon seed layer is not interposed between the base film and the SiO film, it is possible to improve the performance of the device.

[6] By setting the inner temperature of the process chamber in the annealing step and the inner temperature of the process chamber in the SiO film forming step to be the same, it is possible to perform the steps continuously without elevating or lowering the inner temperature of the process chamber. Therefore, it is possible to shorten the time required for the substrate processing, and to improve the throughput.

[7] By performing the annealing step and the SiO film forming step in situ, it is possible to prevent the generation of a natural oxide film and the adhesion of the particles since the wafer is not exposed to an atmosphere outside the process chamber. Therefore, it is possible to improve the quality of the film-forming process.

The same advantageous effects as the embodiments may be obtained similarly when a gas other than the HCDS gas is used as the source gas, when a gas other than the $O_2$ gas and the $H_2$ gas is used as the oxidation gas (oxygen-containing gas), or when a gas other than the $H_2$ gas is used as the hydrogen-containing gas. In addition, the same advantageous effects as the embodiments may be obtained similarly when a gas other than the $N_2$ gas is used as the inert gas.

Other Embodiments

While the technique is described by way of the above-described embodiments in detail, the above-described technique is not limited thereto. The above-described technique may be modified in various ways without departing from the gist thereof.

For example, the above-described embodiments are described by way of an example in which the $N_2$ gas is supplied into the process chamber 201 in the annealing step. However, the above-described technique is not limited thereto. The above-described technique may be applied when the hydrogen-containing gas such as the $H_2$ gas is supplied into the process chamber 201 in the annealing step. By supplying the $H_2$ gas, it is possible to further promote the desorption of the impurities from the silicon seed layer.

For example, the above-described embodiments are described by way of an example in which the reactive gas is supplied after the source gas is supplied. However, the above-described technique is not limited thereto. The above-described technique may be applied when the order of supplying the source gas and the reactive gas is reversed. That is, the above-described technique may be applied when the source gas is supplied after the reactive gas is supplied. By changing the order of supplying the gases, it is possible to change (adjust) the quality or the composition of the film formed on the wafer.

For example, the above-described embodiments are described by way of an example in which the chlorosilane source gas is used as the source gas. However, the above-described technique is not limited thereto. The above-described technique may be applied when the halosilane source gas other than the chlorosilane source gas, for example, the halosilane source gas such as a fluorosilane source gas, a bromosilane source gas and an iodosilane source gas is used as the source gas. In addition, a metalloid source gas containing a metalloid element such as germanium (Ge) other than silicon and a halogen element may be used as the source gas. In addition, a metal source gas containing a metal element such as titanium (Ti), zirconium (Zr), hafnium (Hf), tantalum (Ta), niobium (Nb), molybdenum (Mo), tungsten (W) and aluminum (Al) and a halogen element may be used as the source gas. When the above-described gases are used as the source gas according to the above-described technique, the processing sequences and the processing conditions may be set substantially the same as those of the above-described embodiments.

The recipe used for the substrate processing (film-forming process) may be separately prepared depending on the contents of the substrate processing, and stored in the memory device 121c through an electrical telecommunication line or the external memory device 123. When the substrate processing is started, the CPU 121a may select a proper recipe among a plurality of recipes stored in the memory device 121c, depending on the contents of the substrate processing. Thus, it is possible to form plural kinds of films having various composition ratios, qualities and thicknesses by only a single substrate processing apparatus in a universal and highly reproducible manner. Furthermore, it is possible to reduce the burden of an operator, and to start the substrate processing promptly without an operation mistake.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium having the recipe written therein. The input/output device 122 installed in the existing substrate processing apparatus may be operated to directly change the existing recipe which is already installed in the substrate processing apparatus to the new recipe.

For example, the above-described embodiments are described by way of an example in which a batch type substrate processing apparatus configured to simultaneously process a plurality of substrates is used to form the film. However, the above-described technique is not limited thereto. For example, the above-described technique may be applied to the film formation using a single type substrate processing apparatus configured to simultaneously process a single substrate or a small number of substrates. For example, the above-described embodiments are described by way of an example in which a substrate processing apparatus having a hot wall type process furnace is used to form the film. However, the above-described technique is not limited thereto. For example, the above-described technique may also be applied to the film formation using a substrate processing apparatus having a cold wall type process furnace.

The film formation using these substrate processing apparatuses described above may be performed according to the processing sequences and the processing conditions same as those of the above-described embodiments.

In addition, the above-described embodiments may be combined appropriately. In such cases, the processing sequences and the processing conditions may be set substantially the same as those of the above-described embodiments.

Hereinafter, the results of experiments supporting the effects obtained in the above-described embodiments will be described.

Evaluation on Uniformity of Thickness of Silicon Seed Layer

Using the substrate processing apparatus shown in FIG. 1, a first sample, a second sample, a third sample and a fourth sample are prepared by supplying the HCDS gas to the wafer 200 on which the base film such as the SiO layer is formed as shown in FIG. 5A to form the silicon seed layer 10 with an inner temperature of the process furnace set to 450° C., 500° C., 550° C. and 600° C., respectively. Hereinafter, the inner temperature of the process furnace may be simply referred to as a "furnace temperature".

The first through fourth samples are manufactured by using the HCDS gas as the source gas and the $N_2$ gas as the inert gas. The processing conditions of manufacturing the first through fourth samples such as the supply amount of the gases are the same as those of the above-described embodiments.

Then, the thickness distribution of the silicon seed layer 10, the average thickness of the silicon seed layer 10 and the uniformity of the thickness of the silicon seed layer 10 on the surface of the wafer 200 (hereinafter, the uniformity also referred to as a "WiW") are evaluated for the first through the fourth samples, respectively. The WiW [±%] is a value defined by {(a maximum thickness of the silicon seed layer 10 formed on the surface of the wafer 200)−(a minimum thickness of the silicon seed layer 10 formed on the surface of the wafer 200)}/(2× the average thickness of the silicon seed layer 10 formed on the surface of the wafer 200)×100. The smaller the WiW value is, the more uniform the thickness of the silicon seed layer 10 on the surface of the wafer 200 is.

Figures 6A, 6B:
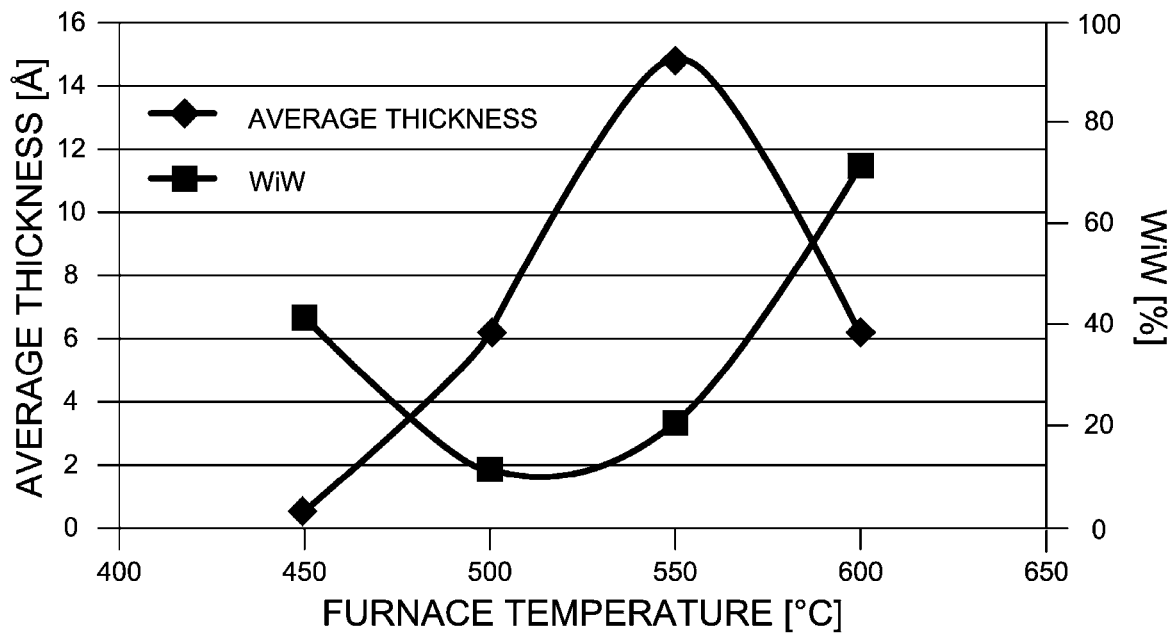
FIG. 6A illustrates evaluation results of a thickness of a silicon seed layer when the seed layer forming step is performed with an inner temperature of the vertical type process furnace set to 450° C., 500° C., 550° C. and 600° C., respectively.
FIG. 6B illustrates a relationship between the inner temperature of the vertical type process furnace and the average thickness of the silicon seed layer obtained based on the evaluation results shown in FIG. 6A.

As shown in FIGS. 6A and 6B, when the furnace temperature is elevated to each temperature from 450° C. to 600° C., respectively, to manufacture the samples, the film-forming rate (deposition rate) increases from around 500° C. at which the decomposition of the HCDS gas starts. However, when the furnace temperature is further elevated to 550° C., the film-forming rate decreases since the silicon seed layer 10 is scraped by an etching action of chlorine (Cl) contained in the HCDS gas. In addition, it is confirmed that the uniformity (WiW) is the best in the second sample prepared at the furnace temperature of 500° C.

Evaluation According to Annealing Process

Example According to Embodiments

In the example according to embodiments, the seed layer forming step and the annealing step described above are performed using the substrate processing apparatus shown in FIG. 1, and then an etching process is performed with diluted hydrofluoric acid (DHF). In the etching process, the DHF is supplied for 1 minute at a supply amount of about 1% of the supply amount of the $N_2$ gas. Other processing conditions such as the supply amount of the gases are the same as those of the above-described embodiments.

Figure 7B:
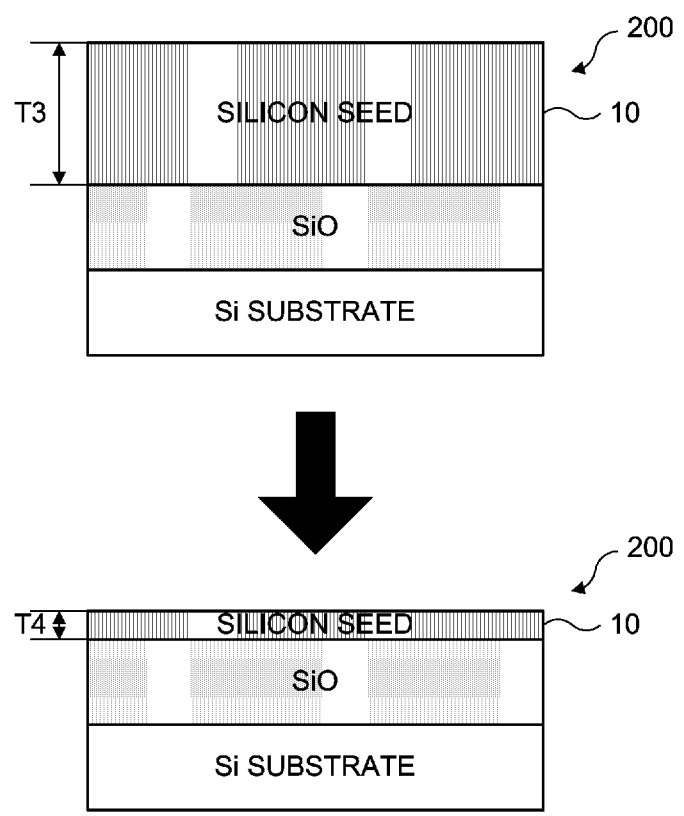
FIG. 7A schematically illustrates vertical cross-sections of the wafer when the seed layer forming step, the annealing step and an etching process are sequentially performed on the wafer, and FIG. 7B schematically illustrates vertical cross-sections of the wafer when the seed layer forming step and the etching process are sequentially performed on the wafer without performing the annealing step.

As shown in FIG. 8, the thickness of the poly-Si layer 12 after the annealing process (that is, a thickness T1 shown in FIG. 7A) is 62.6 Å. The thickness of the poly-Si layer 12 after etching by the DHF (that is, a thickness T2 shown in FIG. 7A) is 59.9 Å. That is, the etched amount (oxidation amount) in the example according to embodiments is 2.7 Å.

Comparative Example

In the comparative example, after the seed layer forming step described above is performed, the same etching process as in the example is performed without performing the annealing step. The processing conditions such as the supply amount of the gases are the same as those of the above-described embodiments.

As shown in FIG. 8, the thickness of the poly-Si layer 12 before etching by the DHF (that is, a thickness T3 shown in FIG. 7B) is 59.3 Å. The thickness of the poly-Si layer 12 after etching by the DHF (that is, a thickness T4 shown in FIG. 7B) is 0.4 Å. That is, the etched amount in the comparative example is 58.9 Å.

That is, as shown in FIG. 8, when the annealing process is not performed, the etched amount of the silicon seed layer 10 by the etching process is about 58.9 Å. That is, the silicon seed layer 10 is substantially removed by the etching process. However, when the annealing process is performed, the etched amount of the silicon seed layer 10 by the etching process is about 2.7 Å. That is, most of the silicon seed layer 10 remains. When the annealing process is not performed, since the silicon seed layer is in an amorphous state, the silicon seed layer is easily etched. However, when the annealing process is performed, since the silicon seed layer is polycrystallized by annealing process, it is difficult to etch the polycrystallized silicon seed layer. That is, it is possible to polycrystallize the silicon seed layer by the above-described annealing process.

In addition, in the formation of the silicon seed layer under the above-described conditions, regardless of the annealing process, the state of the surface of the silicon seed layer is good, and defects such as pinholes are not observed.

Evaluation on Oxidation Amount of Poly-Si layer

Example According to Embodiments

Figure 9A:
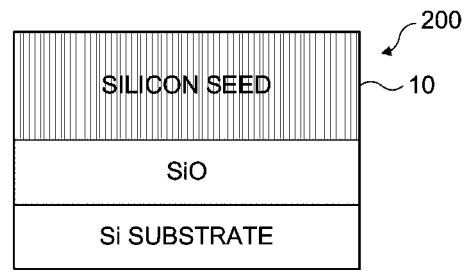
FIG. 9A schematically illustrates the vertical cross-section of the wafer after the seed layer forming step is performed on the wafer, FIG. 9B schematically illustrates the vertical cross-section of the wafer after the annealing step is performed on the wafer shown in FIG. 9A, FIG. 9C schematically illustrates the vertical cross-section of the wafer after the silicon oxide film forming step is performed on the wafer shown in FIG. 9B, and FIG. 9D schematically illustrates the vertical cross-section of the wafer after the etching process is performed on the wafer shown in FIG. 9C.
Figure 9B:
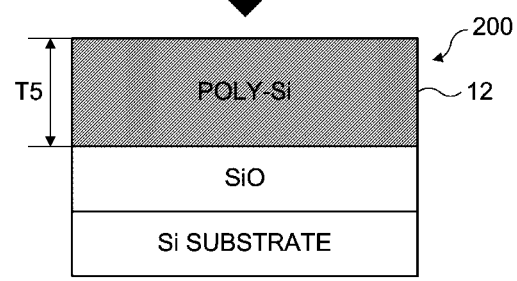

In the example according to embodiments, using the substrate processing apparatus shown in FIG. 1, the silicon seed layer 10 is formed on the wafer 200 on which the base film such as the SiO layer is formed, by performing the seed layer forming step described above as shown in FIG. 9A, and the poly-Si layer 12 is formed by polycrystallizing the silicon seed layer 10 by performing the annealing step described above as shown in FIG. 9B. The thickness of the poly-Si layer 12 after the annealing step (that is, a thickness T5 shown in FIG. 9B) is 29.42 Å. The processing conditions of forming the silicon seed layer 10 and the poly-Si layer 12 are set within the range of the processing conditions of the embodiments described above.

Figure 9C:
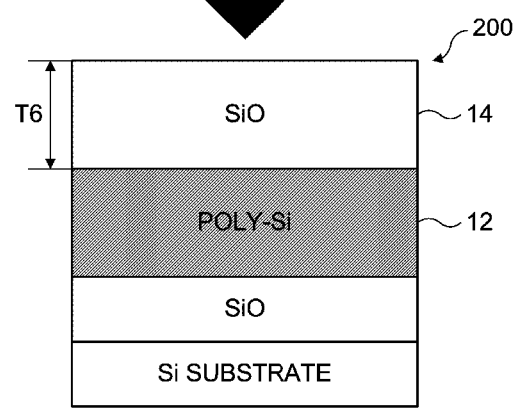

Thereafter, the SiO film 14 is formed on the poly-Si layer 12 by performing the SiO film forming step described above as shown in FIG. 9C. The thickness of the SiO film 14 after the SiO film forming step (that is, a thickness T6 shown in FIG. 9C) is 40.0 Å. The processing conditions of forming the SiO film 14 are set within the range of the processing conditions of the embodiments described above.

Figure 9D:
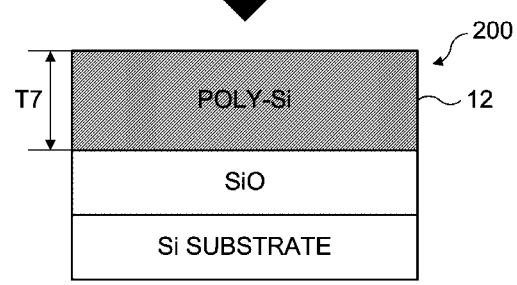

Thereafter, the SiO film 14 is completely removed by performing the etching process by supplying the DHF as shown in FIG. 9D. The thickness of the poly-Si layer 12 after the etching process (that is, a thickness T7 shown in FIG. 9D) is 27.79 Å. The etched amount of the poly-Si layer 12 is 1.63 Å. That is, the poly-Si layer 12 of 1.63 Å is oxidized into an SiO film, and then the SiO film of 1.63 Å is etched by the etching process.

Comparative Example

In the comparative example, a poly-Si layer is formed using monosilane ($SiH_4$) gas as the source gas instead of the HCDS gas. Specifically, as the $SiH_4$ gas is supplied at 700° C. to form the poly-Si layer having a thickness of 1,000 Å. Then, an SiO film having a thickness of 40.0 Å is formed on the poly-Si layer with the furnace temperature is changed to each temperature from 450° C. to 700° C. Then, the SiO film is completely removed by performing the etching process by supplying the DHF, and a thickness of the poly-Si layer after removing the SiO film is measured.

Figure 10:
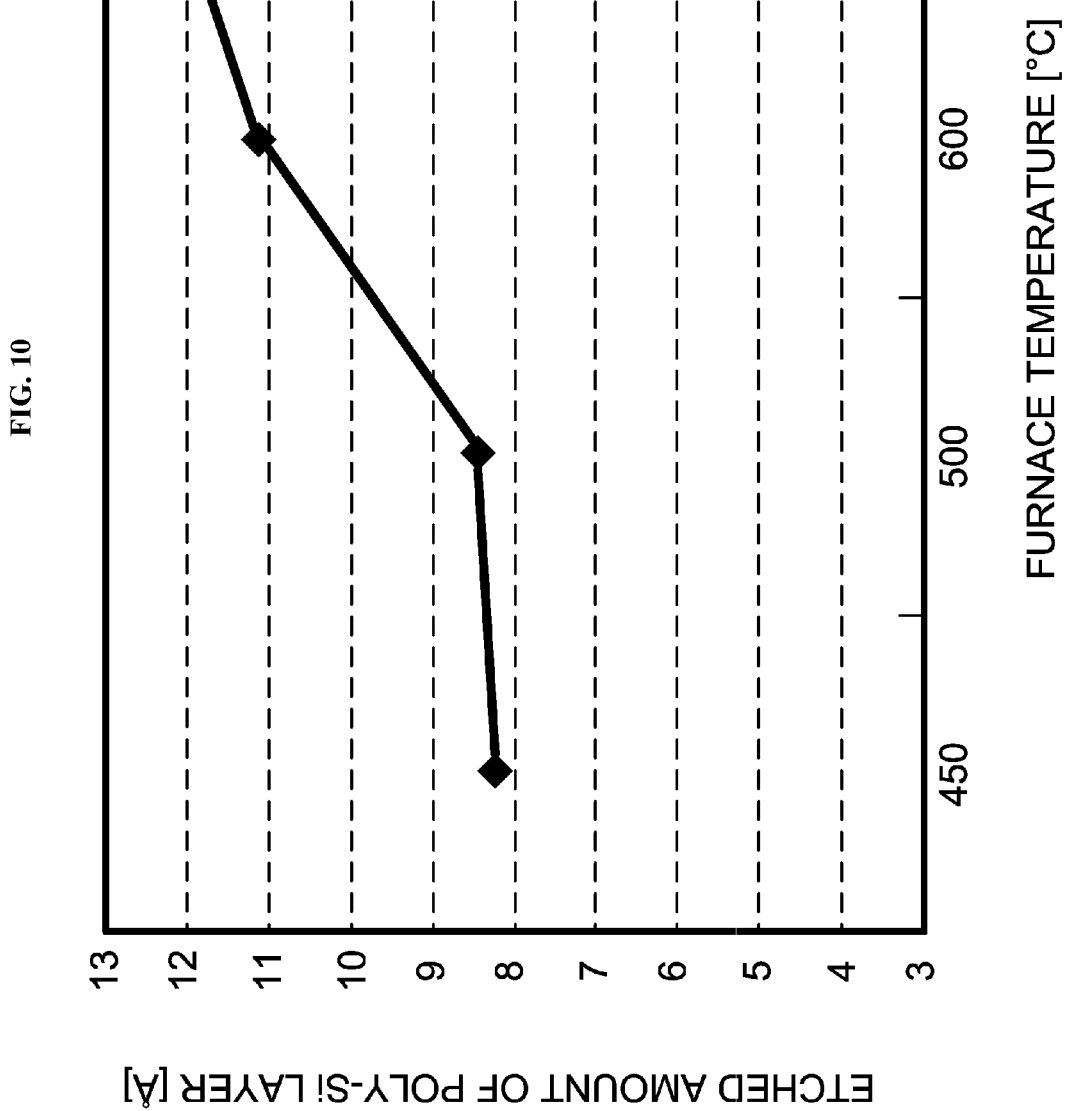
FIG. 10 illustrates a relationship between the inner temperature of the vertical type process furnace and the etched amount of a polysilicon layer according to a comparative example.

As shown in FIG. 10, in the comparative example, the etched amount of the poly-Si layer when the SiO film is formed at 450° C. is about 8 Å, and the etched amount of the poly-Si layer when the SiO film is formed at 700° C. is about 13 Å. As the film-forming temperature of the SiO film increases, the etched amount of the poly-Si layer also increases. The poly-Si layer of about 8 Å to 13 Å is oxidized and etched by the etching process. That is, in the poly-Si layer formed using the $SiH_4$ gas, as the film-forming temperature of the SiO film increases, the influence of the oxidation gas to the poly-Si layer while forming the SiO film also increases and the amount of the poly-Si layer oxidized by the oxidation gas also increases. In addition, when the poly-Si layer is formed using the $SiH_4$ gas according to the comparative example, the film-forming rate of the poly-Si layer is higher than that of the poly-Si layer 12 according to the embodiments. In addition, according to the comparative example, the poly-Si layer may be also formed in the nozzle (gas nozzle) and foreign matters may be generated easily.

Figure 11:
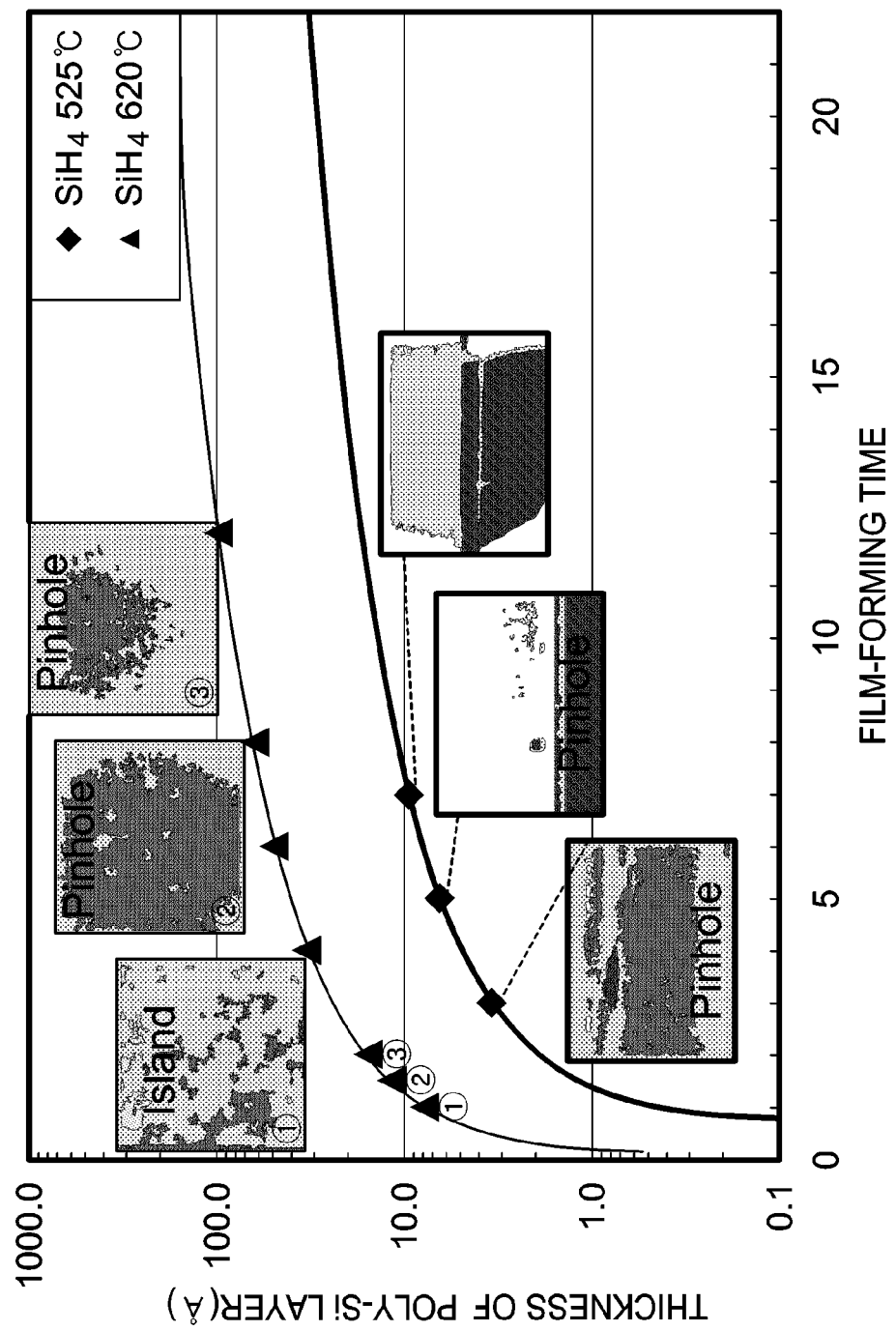
FIG. 11 illustrates a relationship between a film-forming time and a thickness of the polysilicon layer according to the comparative example.

FIG. 11 schematically illustrates a relationship between a film-forming time and a thickness of the poly-Si layer according to the comparative example described above. Specifically, the relationship when the poly-Si layer is formed at 525° C. is indicated by "◊" in FIG. 11 and the relationship when the poly-Si layer is formed at 620° C. is indicated by "Δ" in FIG. 11.

As shown in FIG. 11, the thickness of the poly-Si layer formed at 620° C. is thicker than that of the poly-Si layer formed at 525° C. even when the film-forming times are the same. In addition, in a region where the thickness of the poly-Si layer is equal to or less than 50 Å, pinholes are generated in the poly-Si layers formed at 525° C. and at 620° C. and the SiO films are formed discontinuously. The thinner the thickness of the poly-Si layer, the rougher the surface of the poly-Si layer (that is, the roughness of the poly-Si layer is deteriorated). According to the results shown in FIG. 11, it is confirmed that the poly-Si layer using the SiH4 gas can not sufficiently suppress the oxidation of the base film and may deteriorate the characteristics of the device.

For example, the oxide film may be formed by thermally decomposing the HCDS gas, the $O_2$ gas and the $H_2$ gas and depositing by the gas phase reaction or surface reaction as shown in the SiO film forming step in the embodiments described above. However, the oxygen species generated by mixing of the $O_2$ gas and the $H_2$ gas has a greater oxidizing power at higher temperatures. Therefore, the base film may be damaged greatly. However, as shown in the embodiments described above, by forming the silicon seed layer on the base film using the source gas such as the HCDS gas and polycrystallizing the silicon seed layer to form the poly-Si layer, even when the oxide film is formed on the upper surface of the wafer using the reactive gas having a strong oxidizing power, it is possible to oxidize the poly-Si layer and to suppress the oxidation of the base film.

According to the technique described herein, it is possible to prevent an adverse effect of the reactive gas on the base film.

What is claimed is:

1. A method of manufacturing a semiconductor device, comprising:
    (a) forming a seed layer in an amorphous state on a substrate by supplying a source gas to the substrate;
    (b) polycrystallizing the seed layer by processing the seed layer by heat; and
    (c) performing a cycle a predetermined number of times to form an oxide film on a polycrystallized seed layer and to oxidize the polycrystallized seed layer, the cycle comprising: (c-1) supplying the source gas to the substrate; and (c-2) supplying an oxygen-containing gas and a hydrogen-containing gas to the substrate, wherein (c-1) and (c-2) are non-simultaneously performed.

2. The method of claim 1, wherein the source gas contains a halogen element.

3. The method of claim 1, wherein the source gas contains a halogen element and at least one of a metalloid element and a metal element.

4. The method of claim 1, wherein the source gas contains a halogen element and silicon.

5. The method of claim 1, wherein a supply time of the source gas in (a) is longer than that of the source gas in each cycle of (c).

6. The method of claim 1, wherein a temperature of the substrate in (a) is lower than that of the substrate in (c).

7. The method of claim 1, wherein a temperature of the substrate in (c) is equal to or higher than that of the substrate in (b).

8. The method of claim 1, wherein $N_2$ gas is supplied into a process chamber accommodating the substrate in (b).

9. The method of claim 1, wherein a thickness of the seed layer formed in (a) is equal to or greater than a thickness at which an entirety of the polycrystallized seed layer is oxidized in (c).

10. The method of claim 1, wherein a thickness of the seed layer formed in (a) is less than a thickness at which an entirety of a non-polycrystallized seed layer is oxidized in (c).

11. A substrate processing apparatus comprising:
    a process chamber in which a substrate is processed;
    a source gas supply system configured to supply a source gas to the substrate in the process chamber;
    an oxygen-containing gas supply system configured to supply an oxygen-containing gas to the substrate in the process chamber;
    a hydrogen-containing gas supply system configured to supply a hydrogen-containing gas to the substrate in the process chamber;
    a heater configured to heat the substrate in the process chamber; and
    a controller configured to control the source gas supply system, the oxygen-containing gas supply system, the hydrogen-containing gas supply system and the heater to perform:
        (a) forming a seed layer in an amorphous state on the substrate in the process chamber by supplying the source gas to the substrate;
        (b) polycrystallizing the seed layer by processing the seed layer by heat; and
        (c) performing a cycle a predetermined number of times to form an oxide film on a polycrystallized seed layer and to oxidize the polycrystallized seed layer, the cycle comprising: (c-1) supplying the source gas to the substrate; and (c-2) supplying the oxygen-containing gas and the hydrogen-containing gas to the substrate, wherein (c-1) and (c-2) are non-simultaneously performed.

12. A non-transitory computer-readable recording medium storing a program that causes, by a computer, a substrate processing apparatus to perform:
    (a) forming a seed layer in an amorphous state on a substrate accommodated in a process chamber of the substrate processing apparatus by supplying a source gas to the substrate;
    (b) polycrystallizing the seed layer by processing the seed layer by heat in the process chamber; and
    (c) performing a cycle a predetermined number of times to form an oxide film on a polycrystallized seed layer and to oxidize the polycrystallized seed layer, the cycle comprising: (c-1) supplying the source gas to the substrate in the process chamber; and (c-2) supplying an oxygen-containing gas and a hydrogen-containing gas to the substrate, wherein (c-1) and (c-2) are non-simultaneously performed.

\* \* \* \* \*